(12) United States Patent
Nakamura et al.

(10) Patent No.: US 6,403,221 B1
(45) Date of Patent: Jun. 11, 2002

(54) EPOXY RESIN COMPOSITION, AND ADHESIVE FILM AND PREPREG USING THE COMPOSITION, AND MULTILAYER PRINTED-WIRING BOARD USING THEM, AND PROCESS FOR MANUFACTURING THE SAME

(75) Inventors: Shigeo Nakamura; Tadahiko Yokota, both of Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 2 days.

(21) Appl. No.: 09/684,671

(22) Filed: Oct. 11, 2000

(30) Foreign Application Priority Data

Oct. 13, 1999 (JP) ............................................ 11-291503
Oct. 2, 2000 (JP) ........................................ 2000-302070

(51) Int. Cl.[7] ......................... B32B 15/08; B32B 27/38; B32B 27/04; C08L 63/00; B05D 03/02; B05D 03/04

(52) U.S. Cl. ....................... 428/416; 428/413; 428/414; 428/418; 428/901; 428/297.4; 427/96; 427/307; 427/386; 523/427; 523/428

(58) Field of Search ................................. 428/413, 418, 428/414, 901, 297.4; 523/427, 428, 429; 427/96, 307, 386

(56) References Cited

U.S. PATENT DOCUMENTS 5,760,146 A   6/1998  von Gentzkow et al.
6,124,023 A   9/2000  Furuta et al.
6,235,842 B1 * 5/2001  Kuwano et al. ............. 525/119

FOREIGN PATENT DOCUMENTS

EP   0 844 272    5/1998
JP   09-059346    3/1997
JP   11-279260   10/1999

* cited by examiner

Primary Examiner—Robert Dawson
Assistant Examiner—Michael J Feely
(74) Attorney, Agent, or Firm—Oblon, Spivak, McClelland, Maier & Neustadt, P.C.

(57) ABSTRACT

Epoxy resin compositions which comprise, as essential components, (A) an epoxy resin having two or more epoxy groups in one molecule, (B) a phenolic curing agent, (C) a phenoxy resin containing a bisphenol S skeleton and having a weight average molecular weight of 5,000 to 100,000, and (D) a curing accelerator, are useful for making adhesive films formed by coating the epoxy resin composition on a supporting base film. Such compositions are also useful for making prepregs, by coating and/or impregnating a sheet-shaped reinforced base material made of a fiber with the resin composition, as well as multilayer printed-wiring boards made with such prepregs. Such epoxy resin compositions are also useful for forming conductor layers with excellent adhesiveness without requiring, in the insulating layer, a roughening component which deteriorates performance, as well as multilayer printed-wiring boards.

56 Claims, 1 Drawing Sheet

EPOXY RESIN COMPOSITION, AND ADHESIVE FILM AND PREPREG USING THE COMPOSITION, AND MULTILAYER PRINTED-WIRING BOARD USING THEM, AND PROCESS FOR MANUFACTURING THE SAME

BACKGROUND OF THE INVENTION

1. [Industrial Field of the Invention]

The present invention relates to an epoxy resin composition for an interlayer insulating material in a multilayer printed-wiring board of the build-up type which is formed by stacking alternately conductor circuitry layers and insulating layers, the cured product of the composition exhibiting both high thermal resistance and capability of being roughened with an oxidizing agent. It also relates to an adhesive film and a prepreg made by using the composition, a laminate and a multilayer printed-wiring board made by using them, and a process for manufacturing the same.

2. [Prior Art]

As a process for manufacturing a multilayer printed-wiring board, attention has recently been focused on the build-up type technique wherein an organic insulating layer is formed alternately on a conductor layer of an internal-layer circuit board. Japanese Patent Application Laid-Open (Kokai) Nos. 304931/1995 and 304933/1995 disclose a process for manufacturing a multilayer printed-wiring board which process comprises the steps of coating an internal-layer circuit board having a circuit formed thereon with an epoxy resin composition, curing it under heating, forming an unevenly roughened surface thereon with a roughening agent and forming a conductor layer by plating. And, Japanese Patent Application Laid-Open (Kokai) No. 64960/1996 also discloses a process for manufacturing a multilayer printed-wiring board which process comprises the steps of applying an undercoat adhesive, drying it preliminarily, bonding an additive adhesive in the film form thereto, curing it under heating, roughening it with an alkaline oxidizing agent and forming a conductor layer by plating. As a curing agent for the epoxy resin composition used for these purposes, an amine-type curing agent such as dicyandiamide, an imidazole compound or the like has been generally used. With the recent increase of real loading density, however, similarly to the laminate type, a curing system exhibiting stronger thermal resistance as compared with a conventional system is desired for an interlayer insulating material of the build-up type. As a method for solving such a problem, the inventors have developed an epoxy resin composition for an interlayer insulating material exhibiting both high thermal resistance and capability of being roughened with an oxidizing agent using a phenolic curing agent containing a triazine structure as shown in Japanese Patent Application Laid-Open (Kokai) No. 1547/1999. However, the resin composition of the present invention essentially necessitates a roughening component such as rubber component, the thermal resistance or electric insulation has sometimes come into question in the fields where a finer pattern or a thinner insulating layer is required. Furthermore, in the case where an epoxy resin containing a phosphorus atom which attracts attention as a flame retardant epoxy resin, is used instead of a bromine-type epoxy resin from the viewpoint of recent environmental problems, there exists the problem that a conventional resin composition does not afford any well-roughened surface and therefore, peeling strength of the resulting plated conductor layer is poor.

SUMMARY OF THE INVENTION

[Problems to be Solved by the Invention]

Therefore, it is an object of the present invention to develop an epoxy resin composition for an interlayer insulating material exhibiting both high thermal resistance and capability of being roughened with an oxidizing agent, more particularly, an epoxy resin composition which is capable of giving a finer pattern and making an insulating layer thinner, the cured product of which exhibits good thermal resistance and electric insulating property, and improves peeling strength of the resulting plated conductor layer.

Other objects and advantages of the present invention will be apparent from the following description, drawings, and disclosure.

[Means for Solving the problems]

In view of the aforementioned problems, the present inventors have studied intensively and succeeded in developing an epoxy resin composition for an interlayer insulating material capable of being roughened with an oxidizing agent without necessitating a roughening component in a system of using a phenolic curing agent, on the basis of which the present invention has been made.

Namely, a first embodiment of the present invention relates to an epoxy resin composition comprising, as the essential components, (A) an epoxy resin having two or more epoxy groups in one molecule, (B) a phenolic curing agent, (C) a phenoxy resin containing a bisphenol S skeleton and having a weight average molecular weight of 5,000 to 100,000, and (D) a curing accelerator.

Particularly, preferred is the epoxy resin composition wherein the epoxy resin (A) contains a phosphorus atom, the phenolic curing agent (B) contains a nitrogen atom, and the phenoxy resin (C) contains a bisphenol S skeleton and a biphenyl skeleton.

A second embodiment of the present invention relates to an adhesive film which is obtainable by forming a thin film of the epoxy resin composition of the present invention on a supporting base film.

A third embodiment of the present invention relates to a prepreg which is obtainable by coating and/or impregnating a sheet-shape reinforced base material made of a fiber with the above-described epoxy resin composition.

A fourth embodiment of the present invention relates to a multilayer printed-wiring board wherein a plated conductor layer is formed on the roughened surface of a cured product of the above-described epoxy resin composition and the other surface is closely laminated onto a patterned internal-layer circuit board.

A fifth embodiment of the present invention relates to a multilayer printed-wiring board which is obtainable by the steps of coating a patterned internal-layer circuit board with the above-described epoxy resin composition, curing it under heating, roughening the surface of the cured product with an oxidizing agent, and forming a conductor layer on the roughened surface by plating;

a multilayer printed-wiring board which is obtainable by the steps of laminating the above-described adhesive film on a patterned internal-layer circuit board under conditions of pressurizing and heating, detaching the supporting base film, if necessary, curing the epoxy resin composition under heating, roughening the surface of the cured composition layer with an oxidizing agent, and forming a conductor layer on the roughened surface by plating; and a multilayer printed-wiring board which is obtainable by the steps of laminating the above-described prepreg on a patterned internal-layer circuit board under conditions of pressurizing and heating to integrate them, roughening the surface of the prepreg with an oxidizing agent, and forming a conductor layer on the roughened surface by plating.

A sixth embodiment of the present invention relates to a process for manufacturing a multilayer printed-wiring board comprising the steps of coating a patterned internal-layer circuit board with the above-described epoxy resin composition, curing it under heating, roughening the surface of the cured composition with an oxidizing agent, and forming a conductor layer on the roughened surface by plating;

a process for manufacturing a multilayer printed-wiring board comprising the steps of laminating the above-described adhesive film on a patterned internal-layer circuit board under conditions of pressurizing and heating, detaching the supporting base film, if necessary, curing the epoxy resin composition under heating, roughening the surface of the cured product layer with an oxidizing agent, and forming a conductor layer on the roughened surface by plating; and a process for manufacturing a multilayer printed-wiring board comprising the steps of laminating the above-described prepreg on a patterned internal-layer circuit board under conditions of pressurizing and heating to integrate them, roughening a surface of the prepreg with an oxidizing agent, and forming a conductor layer on the roughened surface by plating.

A seventh embodiment of the present invention relates to a laminate which is obtainable by the steps of coating a surface formed by etching out a copper foil of a copper foil-clad laminate on both sides or at least one surface of an unclad laminate with the above-described epoxy resin composition, and curing it under heating;

a laminate which is obtainable by the steps of laminating the above-described adhesive film on a surface formed by etching out a copper foil of a copper foil-clad laminate on both sides or at least one surface of an unclad laminate under conditions of pressurizing and heating, detaching the supporting base film, if necessary, and curing it under heating;

a laminate which is obtainable by laminating the above-described prepreg on a surface formed by etching out a copper foil of a copper foil-clad laminate on both sides or at least one surface of an unclad plate under conditions of pressurizing and heating; and a laminate which is obtainable by laminating the above-described prepreg under conditions of pressurizing and heating.

BRIEF DESCRIPTION OF THE DRAWINGS

FIG. 1a shows an SEM photograph of the roughened surface obtained in Manufacturing Example 1; FIG. 1b, that in Manufacturing Example 2; FIG. 1c, that in Manufacturing Example 3; FIG. 1d, that in Comparative Manufacturing Example 1; and FIG. 1e, that in Comparative Manufacturing Example 2.

DETAILED DESCRIPTION OF THE INVENTION

Figure 1:
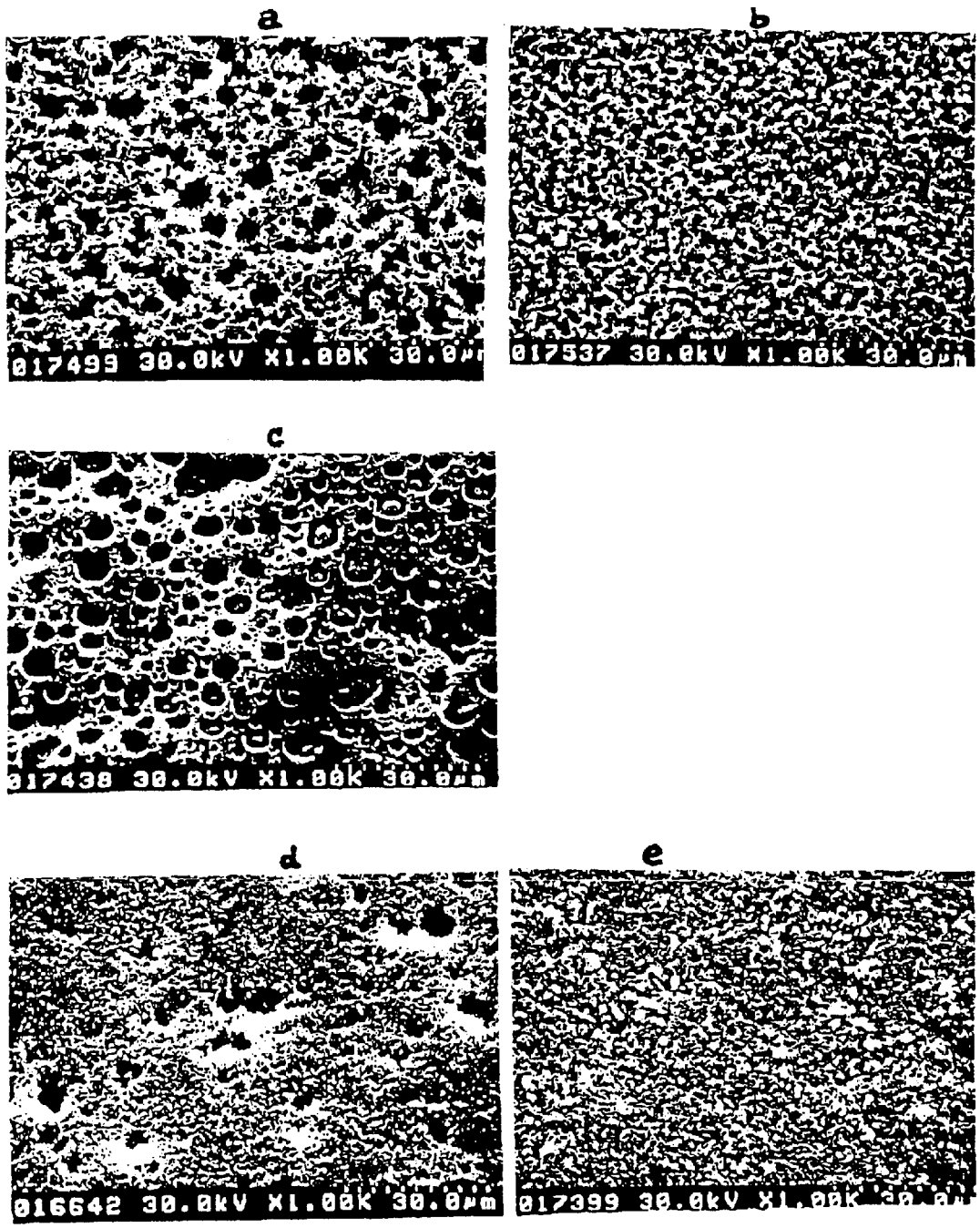
FIG. 1 shows SEM photographs of the cured resin surfaces after roughening with regard to four-layer printed-wiring boards.

The epoxy resin having two or more epoxy groups in each molecule, which is to be used as the component (A) according to the present invention, is necessary for attaining an interlayer insulating material having sufficiently high levels of physical properties, such as thermal resistance and chemical resistance, and electrical properties. More specifically, it is possible to use one of known and commonly used resins such as a bisphenol A type epoxy resin, a bisphenol F type epoxy resin, a bisphenol S type epoxy resin, a phenol novolak type epoxy resin, an alkylphenol novolak type epoxy resin, a biphenyl type epoxy resin, a naphthalene type epoxy resin, a dicyclopentadiene type epoxy resin, an epoxidated product of a condensation product of a phenol and an aromatic aldehyde having phenolic hydroxyl group(s), triglycidyl isocyanurate, and an alicyclic epoxy resin, or a combination of two or more of the above epoxy resins. It may contain a monofunctional epoxy resin as a reactive diluent.

The epoxy resin (A) may contain a phosphorus atom. It is possible to use an epoxy resin containing a phosphorus atom which recently attracts attention as a flame retardant epoxy resin. The epoxy resin containing a phosphorus atom may be exemplified by those disclosed in Japanese Patent Application Laid-open (Kokai) Nos. 11662/1992 and 166035/1999.

As the phenolic curing agent to be used as the component (B) according to the present invention, it is possible to use one of known and commonly used resins such as a phenol novolak resin, an alkylphenol novolak resin, a bisphenol A novolak resin, a dicyclopentadiene type phenol resin, a xylok type phenol resin, a terpene-modified phenol resin, and a polyvinylphenol, or a combination of two or more of the above compounds. Furthermore, the phenolic curing agent (B) may contain a nitrogen atom. The use of the phenolic curing agent improves uninflammability and adhesiveness. The phenolic curing agent containing a nitrogen atom may be exemplified by a series of "Phenolite" 7050 manufactured by Dainippon Ink & Chemicals, Incorporated, which are novolak resins containing a triazine structure, and a melamine-modified phenol novolak resin manufactured by Yuka Shell K.K. With regard to the mixing amount of the aforementioned phenol resin, it is desirable to mix 0.5 to 1.3 phenolic hydroxyl group equivalents of the phenol resin relative to one epoxy equivalent of the epoxy resin (A). Deviation from the range may result in the problem that thermal resistance of the resulting epoxy resin composition is deteriorated.

In order to attain good roughening with an oxidizing agent after curing under heating, the component (C) to be used according to the present invention is necessarily a phenoxy resin containing a bisphenol S skeleton and having a weight average molecular weight of 5,000 to 100,000. Furthermore, the phenoxy resin(C) preferably contains a bisphenol S skeleton and a bisphenol skeleton, and has a weight average molecular weight of 5,000 to 100,000. The phenoxy resin, because it contains a sulfone group, is less compatible with an epoxy resin, so that it is compatibly soluble in a varnish formed by dissolving the epoxy resin composition in a solvent, but an island structure is formed by phase separation in a cured product of an epoxy resin composition after curing under heating. Accordingly, it becomes possible to obtain a well-roughened surface without adding any roughening component. When the weight average molecular weight is less than 5,000, the effect of the phase separation cannot be attained, and when it exceeds 100,000, the phenoxy resin becomes hardly soluble in an organic solvent and therefore, cannot be used. The phenoxy resin is obtainable according to known and conventional methods such as a method of reacting bifunctional epoxy resin with bisphenol S, a method of reacting a bisphenol S type epoxy resin with bisphenol, or the like. Among them, a phenoxy resin composed of a biphenyl type epoxy resin and bisphenol S has such characteristics that the resin itself has a high glass transition point as well as it affords a tight roughened surface. The mixing amount of the phenoxy resin (C) ranges from 5 to 50 parts by weight relative to 100 parts by weight in total of the epoxy resin (A) and the phenolic curing agent (B), and the most suitable amount is selected depending on the skeleton. The amount of less than 5% by weight is not preferred because of insufficient capability of being roughened, whereas the amount exceeding 50% by weight is also not preferred because of occurrence of phase separation of resin varnish itself or inversion of the island structure of a cured product. The phenoxy resin improves mechanical strength and flexibility of the cured coating film as well as it exhibits an effect of facilitating control of melt viscosity of the resin in an adhesive film and/or prepreg and an effect of prevention of repelling. In addition, it is possible to use the resin in combination with a binder polymer such as a usual phenoxy resin, a polyacrylate resin, a polyimide resin, a polyamidimide resin, a polycyanate resin, a polyester resin, or a thermosetting polyphenylene ether resin.

With regard to the curing accelerator to be used as the component (D) according to the present invention, it is possible to use one of known and commonly used substances including an imidazole, a tertiary amine, a guanidine, or an epoxy adduct or a microcapsulated product thereof, and an organic phosphine compound such as triphenylphosphine or tetraphenyl phosphonium tetraphenyl borate, or a combination of two or more of the above substances. The mixing amount of the curing accelerator (D) is preferably in the range of 0.05 to 10 parts by weight relative to 100 parts by weight in total of the epoxy resin (A) and the phenolic curing agent (B). The amount of less than 0.05 parts by weight results in insufficient curing, whereas the amount exceeding 10 parts by weight is not effective for any further acceleration of curing, but rather results in the problem of deteriorating thermal resistance and/or mechanical strength. That is, with regard to the first embodiment of the present invention, preferred is an epoxy resin composition wherein 5 to 50 parts by weight of the phenoxy resin (C) and 0.05 to 10 parts by weight of the curing accelerator (D) are mixed with 100 parts by weight in total of the epoxy resin (A) and the phenolic curing agent (B).

The epoxy resin composition of the present invention may further contain a thermosetting resin and known and a commonly used additive in addition to the components described above. Examples of the thermosetting resin include a blocked isocyanate resin, a xylene resin, a radical initiator and a polymerizable resin, and the like. Examples of the additive include an inorganic filler such as barium sulfate, barium titanate, a silicon oxide powder, amorphous silica, talc, clay, a mica powder, aluminum hydroxide, magnesium hydroxide, or the like; an organic filler such as a silicone powder, a nylon powder, a fluoride powder, or the like; a thickening agent such as asbestos, orben, bentone, or the like; a silicone type, fluoride type or macromolecule type defoaming and/or leveling agent; an adhesion improver such as an imidazole, a thiazole, a triazole, a silane coupling agent, or the like; and an additive such as a phosphorus flame retardant. It is also possible to use a known and commonly used coloring agent such as Phthalocyanine Blue, Phthalocyanine Green, Iodine Green, Disazo Yellow, titanium oxide, carbon black, or the like, if necessary.

The second embodiment of the present invention relates to an adhesive film obtainable by forming a thin film of the epoxy resin composition on a supporting base film. The process for manufacturing an adhesive film comprises applying a resin varnish, wherein the resin composition has been dissolved in a prescribed solvent, on the surface of a supporting base film which is used as a support, and evaporating the solvent through heating and/or exposing to a hot air blast to form a thin film. The supporting base film may be exemplified by a polyolefin such as polyethylene, polyvinyl chloride, or the like, a polyester such as polyethylene terephthalate, or the like, a polycarbonate, a polyimide, a release paper, or a metal foil such as copper foil or aluminum foil. The supporting base film is able to have been subjected to mat treatment and corona treatment as well as peelable treatment. As the organic solvent, it is possible to use one of ordinary solvents including ketones such as acetone, methyl ethyl ketone, cyclohexanone and the like, esters of acetic acid such as ethyl acetate, butyl acetate, cellosolve acetate, propylene glycol monomethyl ether acetate, carbitol acetate and the like, cellosolves such as cellosolve, butyl cellosolve and the like, carbitols such as carbitol, butyl carbitol and the like, aromatic hydrocarbons such as toluene, xylene and the like, dimethylformamide, dimethylacetamide, and the like, or a combination of two or more of the above solvents. More specifically, the adhesive film is the film formed by laminating a supporting base film having a thickness of 10 to 200 $\mu$m with an epoxy resin composition layer having a thickness of the range of 10 to 150 $\mu$m, which should not be less than the thickness of a conductor layer of the internal-layer circuit board to be laminated, and further laminating the other surface of the resin layer with a protective film such as a supporting film having a thickness of 1 to 40 $\mu$m, and the resulting film is stored with winding up to a roll.

With regard to the third embodiment of the present invention, the prepreg can be prepared by coating and/or impregnating a sheet-shape reinforced base material made of a fiber with the epoxy resin composition according to a hot-melt method or a solvent method, and heating to semi-cure the composition. As the sheet-shape reinforced base material made of a fiber, it is possible to use a known and commonly used fiber for a prepreg such as glass cloth or aramide fiber. Among hot-melt methods, there are known, for example, a method of temporarily coating a coated paper easily releasable from a resin with a solvent-free resin composition and laminating it, and a method of directly coating a solvent-free resin composition with a die coater. The solvent method includes the steps of dipping the sheet-shape reinforced base material in a resin varnish wherein the epoxy resin composition has been dissolved in an organic solvent, to impregnate the material with the resin varnish, and then drying it to obtain a prepreg.

The fourth embodiment of the present invention relates to a multilayer printed-wiring board wherein a plated conductor layer is formed on the roughened surface of a cured product of the epoxy resin composition while the other surface is closely laminated onto a patterned internal-layer circuit board.

The following will explain a process for manufacturing a multilayer printed-wiring board using an epoxy resin composition of the present invention. The epoxy resin composition of the present invention is first coated on a patterned internal-layer circuit board, and cured under heating, after drying when it contains an organic solvent. The internal-layer circuit board may be a glass/epoxy laminate, a metal board, a polyester board, a polyimide board, a BT resin board, a thermosetting polyphenylene ether board, or the like, and the surface of the circuit is able to have been subjected to roughening treatment in advance. The drying is preferably carried out at 70 to 130° C. for 5 to 40 minutes. The heat-curing is preferably carried out under heating at 130 to 180° C. for 15 to 90 minutes. After the curing under heating, necessary through holes or via holes are made by a drill and/or a laser or plasma. Then, roughening treatment is given with an oxidizing agent such as a permanganate, a bichromate, ozone, hydrogen peroxide/sulfuric acid, nitric acid, or the like, to form protrusive anchors on the surface of the adhesive layer. Then, a conductor layer is formed by nonelectrolytic and/or electrolytic plating. At this time, when a plated resist having the pattern reverse to that of the conductor layer is formed in advance, the conductor layer may be formed simply by nonelectrolytic plating. After the conductor layer has been thus formed, by annealing it at 150 to 180° C. for 20 to 60 minutes, any residual unreacted epoxy resin can be cured to enhance the peeling strength of the conductor layer to a further extent.

With regard to the sixth embodiment of the present invention, the above-described adhesive film is laminated on a patterned internal-layer circuit board for manufacturing a multilayer printed-wiring board using an adhesive film composed of the epoxy resin composition of the present invention, the supporting base film, and, if necessary, a protective film. After removing the protective film in the case where a protective film is present, the lamination is carried out by sticking the thin film of the epoxy resin composition having a property of an adhesive on the circuit board with pressurizing and heating. It is preferable to carry out the lamination at a pressing temperature of 70 to 130° C. and a pressing pressure of 1 to 11 kgf/cm$^2$ under reduced pressure after preheating the film and the internal-layer circuit board, if necessary. The lamination may be carried out by a process either batchwise or continuously by means of a roll. After the lamination, the resulting laminate is cooled to around room temperature. Then, the supporting film is detached to transfer the epoxy resin composition on the internal-layer circuit board, and the composition is cured under heating. In the case where a supporting film which has been subjected to peelable treatment is used, the supporting film may be detached after the curing under heating. Thereafter, similarly to the method described above, a multilayer printed-wiring board can be manufactured by roughening the surface of the film with an oxidizing agent and forming a conductor layer on the roughened surface by plating.

On the other hand, for manufacturing a multilayer printed-wiring board using a prepreg composed of the epoxy resin composition of the present invention, firstly, one sheet or, if necessary, several sheets of the prepreg are stacked on a patterned internal-layer circuit board, put between metal plates with intervening release films, and then pressed under conditions of pressurizing and heating. The shaping is preferably carried out under a pressure of 5 to 40 kgf/cm$^2$ at a temperature of 120 to 180° C. for 20 to 100 minutes. It is also possible to manufacture an intermediate product for the same purpose according to the aforementioned lamination process. Thereafter, similarly to the method described above, a multilayer printed-wiring board can be manufactured by roughening the surface of the prepreg with an oxidizing agent and forming a conductor layer on the roughened surface by plating. When the internal-layer circuit board has two or more layers of a patterned internal-layer circuit in the same direction, the multilayer printed-wiring board thus manufactured will possess insulating layer(s) of the cured product of the epoxy resin composition according to any one of claims 1 to 5 between the internal-layer circuits. "A patterned internal-layer circuit" named in the present invention is a relative name toward "a multilayer printed-wiring board". For example, after circuits are formed on both the surfaces of a substrate board and cured thin films of the epoxy resin composition are further formed as insulating layers on the surfaces of both the circuits, a four-layer printed-wiring board can be formed by further formation of circuits on both the resulting surfaces. In this case, an internal-layer circuit board means a printed-wiring board wherein circuits are formed on both the surfaces of a substrate board. Furthermore, when one more layer of a circuit is additionally formed on each of both the surfaces of the four-layer printed-wiring board with an intervening insulating layer, a six-layer printed-wiring board results. In this case, an internal-layer circuit board means the aforementioned four-layer printed-wiring board.

The fifth embodiment invention of the present invention relates to a multilayer printed-wiring board manufactured according to the above-described sixth embodiment of the present invention, and more particularly, it relates to a multilayer printed-wiring board which is obtainable by the steps of coating a patterned internal-layer circuit board with the above-described epoxy resin composition, curing it under heating, roughening the surface of the cured resin composition with an oxidizing agent, and forming a conductor layer on the roughened surface by plating; a multilayer printed-wiring board which is obtainable by the steps of laminating the above-described adhesive film on a patterned internal-layer circuit board under conditions of pressurizing and heating, detaching the supporting base film if necessary, curing the epoxy resin composition under heating, roughening the surface of the cured resin composition layer with an oxidizing agent, and forming a conductor layer on the roughened surface by plating; and a multilayer printed-wiring board which is obtainable by the steps of laminating the above-described prepreg on a patterned internal-layer circuit board under conditions of pressurizing and heating to integrate them, roughening the surface of the prepreg with an oxidizing agent, and forming a conductor layer on the roughened surface by plating.

With regard to the seventh embodiment of the present invention, the following will describe a process for manufacturing a laminate which is obtainable by the steps of coating the surface formed by etching out a copper foil of a copper foil-clad laminate on both sides or at least one surface of an unclad laminate with the above-described epoxy resin composition, and curing it under heating; a laminate which is obtainable by the steps of laminating the above-described adhesive film on the surface formed by etching out a copper foil of a copper foil-clad laminate on both sides or at least one surface of an unclad laminate under conditions of pressurizing and heating, detaching the supporting base film, if necessary, and curing it under heating; a laminate which is obtainable by laminating the above-described prepreg on the surface formed by etching out a copper foil of a copper foil-clad laminate on both sides or at least one surface of an unclad plate under conditions of pressurizing and heating; and a laminate which is obtainable by laminating the above-described prepreg under conditions of pressurizing and heating.

A laminate is obtainable by coating the surface formed by etching out a copper foil of a copper foil-clad laminate on both sides or at least one surface of an unclad laminate with the above-described epoxy resin composition of the present invention, and curing it under heating. The aforementioned unclad laminate is obtainable by using a release film or the like instead of a copper-foil upon manufacturing the copper foil-clad laminate. The laminate thus obtained is subjected to roughening treatment with an oxidizing agent such as a permanganate, a bichromate, ozone, hydrogen peroxide/ sulfuric acid, or nitric acid to form protrusive anchors on the surface of the laminate. Then, a conductor layer can be directly formed on the surface of the laminate by nonelectrolytic and/or electrolytic plating.

A laminate is also obtainable by laminating an adhesive film composed of the epoxy resin composition of the present invention on the surface formed by etching out a copper foil of a copper foil-clad laminate on both sides or at least one surface of an unclad laminate, and curing it under heating. The laminate thus obtained is subjected to a roughening treatment with an oxidizing agent such as a permanganate, a bichromate, ozone, hydrogen peroxide/sulfuric acid, or nitric acid to form protrusive anchors on the surface of the laminate. Then, a conductor layer can be directly formed on the surface of the laminate by nonelectrolytic and/or electrolytic plating.

A laminate is obtainable by stacking a prescribed number of sheets of the prepreg composed of the epoxy resin composition of the present invention or placing it on a surface formed by etching out a copper foil of a copper foil-clad laminate on both sides or at least one surface of an unclad laminate, putting the resulting stack or laminate between metal plates with intervening release films, and then pressing under conditions of pressurizing and heating. The laminate thus obtained is subjected to roughening treatment with an oxidizing agent such as a permanganate, a bichromate, ozone, hydrogen peroxide/sulfuric acid, or nitric acid to form protrusive anchors on the surface of the laminate. Then, a conductor layer can be directly formed on the surface of the laminate by nonelectrolytic and/or electrolytic plating.

EXAMPLES

The present invention will be explained more specifically with reference to Examples, Comparative Examples, Manufacturing Examples, and Comparative Manufacturing Examples, but the present invention is not limited thereby.

Example 1

An epoxy resin composition was prepared by dissolving 20 parts by weight (hereinafter, the mixing amounts being all expressed in parts by weight) of a bisphenol A type epoxy resin ("Epicoat 828" manufactured by Yuka Shell Epoxy K.K., and having an epoxy equivalent of 185) and 45 parts of a cresol novolak type epoxy resin ("EPICLON N-673" manufactured by Dainippon Ink & Chemicals, Incorporated, and having an epoxy equivalent of 215) as the component (A) and 30 parts of a phenol novolak resin ("Phenolite" manufactured by Dainippon Ink & Chemicals, Incorporated, and having a phenolic hydroxyl equivalent of 105) as the component (B) in 20 parts of ethyl diglycol acetate and 20 parts of solvent naphtha under heating with stirring, followed by cooling the resulting mixture to room temperature, and adding thereto 30 parts of a cyclohexanone varnish of a phenoxy resin composed of the "828" and bisphenol S ("YL6747H30" manufactured by Yuka Shell Epoxy K.K., containing 30% by weight of nonvolatile matter and having a weight average molecular weight of 47000) as the component (C), and 0.8 parts of a crushed product of 2-phenyl-4,5-bis(hydroxymethyl)imidazole as the component (D), as well as 2 parts of finely divided silica and 0.5 parts of a silicone type defoaming agent.

Example 2

An epoxy resin composition was prepared by dissolving 20 parts of a bisphenol A type epoxy resin ("Epicoat 828" manufactured by Yuka Shell Epoxy K.K.), and 45 parts of a phosphorus-containing epoxy resin described in Synthetic Example 1 of Japanese Patent Application Laid-open (Kokai) No. 166035/1999 (epoxy equivalent of 300, and phosphorus content of 2.0% by weight) as the component (A) in methyl ethyl ketone (hereinafter, referred to as MEK) under heating with stirring, followed by cooling the resulting mixture to room temperature, and adding thereto 50 parts of a MEK varnish of a phenol novolak resin containing a triazine structure ("Phenolite LA-7052" manufactured by Dainippon Ink & Chemicals, Incorporated, containing 60% of nonvolatile matter and having a phenolic hydroxyl equivalent of 120) as the component (B), 70 parts of a cyclohexanone varnish of a phenoxy resin composed of a tetramethyl type biphenyl epoxy resin ("YX-4000" manufactured by Yuka Shell Epoxy K.K.) and bisphenol S ("YL6746H30" manufactured by Yuka Shell Epoxy K.K. containing 30% by weight of nonvolatile matter, and having a weight average molecular weight of 30000) as the component (C), and 0.5 parts of a crushed product of 2,4-diamino-6-(2-methyl-1-imidazolylethyl)-1,3,5-triazine.isocyanurate adduct as the component (D), as well as 2 parts of finely divided silica. The epoxy resin composition as prepared in the varnish form was applied by a roller coater onto a PET film having a thickness of 38 $\mu$m in such amount that the resulting layer should have a thickness of 60 $\mu$m after dried, and was dried at 80 to 120° C. for 10 minutes, whereby an adhesive film was obtained.

Example 3

An epoxy resin composition was prepared by dissolving 15 parts of a cresol novolak type epoxy resin ("EPICLON N-673" manufactured by Dainippon Ink & Chemicals, Incorporated), and 50 parts of a phosphorus-containing epoxy resin described in Synthetic Example 1 of Japanese Patent Application Laid-open (Kokai) No. 166035/1999 (epoxy equivalent of 300, and phosphorus content of 2.0% by weight) as the component (A) in MEK under heating with stirring, followed by cooling the resulting mixture to room temperature, adding thereto 45 parts of an MEK varnish of a phenol novolak resin containing a triazine structure ("Phenolite LA-7052" manufactured by Dainippon Ink & Chemicals, Incorporated) as the component (B), 50 parts of a cyclohexanone varnish of a phenoxy resin composed of a tetramethyl type biphenyl epoxy resin and bisphenol S ("YL6746H30" manufactured by Yuka Shell Epoxy K.K.) as the component (C), and 0.5 parts of a crushed product of 2,4-diamino-6-(2-methyl-1-imidazolylethyl) -1,3,5-triazine•isocyanurate adduct as the component (D), as well as 20 parts of a phenoxy resin varnish ("YP-50-EK35" manufactured by Tohto Kasei Co., Ltd.) and 2 parts of finely divided silica. An aramide fiber cloth ("Technola" manufactured by Teijin Limited) was impregnated with the epoxy resin composition as prepared in the varnish form and the impregnated was dried at 150° C., whereby a prepreg having a resin content of about 45% by weight and a thickness of 0.1 mm was obtained.

Example 4

A glass cloth of 100 $\mu$m in thickness was impregnated with the epoxy resin composition described in Example 2 and the impregnated was dried at 80 to 120° C. for 10 minutes, whereby a prepreg having a resin content of 40% was obtained.

Example 5

A glass cloth of 34 $\mu$m in thickness was impregnated with the epoxy resin composition described in Example 2 and the impregnated was dried at 80 to 120° C. for 10 minutes, whereby a prepreg having a resin content of 75% was obtained.

Comparative Example 1

An epoxy resin composition was prepared by dissolving 20 parts by weight of a bisphenol A type epoxy resin ("Epicoat 828" manufactured by Yuka Shell Epoxy K.K.) and 45 parts of a cresol novolak type epoxy resin ("EPICLON N-673" manufactured by Dainippon Ink & Chemicals, Incorporated) as the component (A) and 30 parts of a phenol novolak resin ("Phenolite" manufactured by Dainippon Ink & Chemicals, Incorporated) as the component (B) in 20 parts of ethyl diglycol acetate and 20 parts of solvent naphtha under heating with stirring, followed by cooling the resulting mixture to room temperature, adding thereto 30 parts of a phenoxy resin varnish ("YP-50-EK35" manufactured by Tohto Kasei Co., Ltd.), and 0.8 parts of a crushed product of 2-phenyl-4,5-bis (hydroxymethyl) imidazole as the component (D), as well as 2 parts of finely divided silica and 0.5 parts of a silicone type defoaming agent.

Comparative Example 2

An epoxy resin composition was prepared by dissolving 20 parts of a bisphenol A type epoxy resin ("Epicoat 828" manufactured by Yuka Shell Epoxy K.K.), and 45 parts of a phosphorus-containing epoxy resin described in Synthetic Example 1 of Japanese Patent Application Laid-open (Kokai) No. 166035/1999 (epoxy equivalent of 300, and phosphorus content of 2.0% by weight) as the component (A) in MEK under heating with stirring, followed by cooling the resulting mixture to room temperature, adding thereto 50 parts of an MEK varnish of a phenol novolak resin containing a triazine structure ("Phenolite LA-7052" manufactured by Dainippon Ink & Chemicals, Incorporated) as the component (B), 15 parts of end-epoxidated polybutadiene rubber ("Denarex R-45EPT" ex Nagase Chemicals Ltd.), 15 parts of calcium carbonate, 30 parts of a phenoxy resin varnish ("YP-50-EK35" manufactured by Tohto Kasei Co., Ltd.), and 0.5 parts of a crushed product of 2,4-diamino-6-(2-methyl-1-imidazolylethyl)-1,3,5-triazine•isocyanurate adduct as the component (D), as well as 2 parts of finely divided silica. The epoxy resin composition as prepared in the varnish form was applied by a roller coater onto a PET film having a thickness of 38 $\mu$m in such amount that the resulting layer should have a thickness of 60 $\mu$m after dried, and was dried at 80 to 120° C. for 10 minutes, whereby an adhesive film was obtained.

Manufacturing Example 1

An internal-layer circuit board was formed from a glass/epoxy laminate clad on both sides with a copper foil having a thickness of 35 $\mu$m, and the epoxy resin composition obtained in Example 1 was applied thereon by screen printing and dried at 120° C. for 10 minutes. Then, the composition was also applied on the reverse side and dried similarly, and cured under heating at 170° C. for 30 minutes. Thereafter, the necessary through holes or via holes were made with a drill and/or a laser, and after roughening the surface of the resin layer with an alkaline oxidizing agent of a permanganate (a reagent solution manufactured by Atotech Japan Co., Ltd.), nonelectrolytic and/or electrolytic plating was performed and a four-layer printed-wiring board was obtained in accordance with a subtractive process. Then, the board was further subjected to an annealing treatment by heating at 170° C. for 30 minutes.

Manufacturing Example 2

An internal-layer circuit board was formed from a glass/epoxy laminate clad on both sides with a copper foil having a thickness of 35 $\mu$m, and the adhesive film obtained in Example 2 was laminated on both sides of the board with a vacuum laminator at a temperature of 110° C., a pressure of 1 kgf/cm$_2$ and an atmospheric pressure of 5 mmHg or below, and then the PET film was detached, followed by curing the resin composition under heating at 170° C. for 30 minutes. Thereafter, the necessary through holes or via holes were made with a drill and/or a laser, followed by roughening the surface of the film with an alkaline oxidizing agent of a permanganate, nonelectrolytic and/or electrolytic plating was performed and a four-layer printed-wiring board was obtained in accordance with a subtractive process. Then, the board was further subjected to an annealing treatment by heating at 150° C. for 30 minutes.

Manufacturing Example 3

An internal-layer circuit board was formed from a glass/epoxy laminate clad on both sides with a copper foil having a thickness of 35 $\mu$m, and one sheet of the prepreg obtained in Example 3 was stacked on each of both the sides thereof and the stack was placed between metal plates with intervening release films, and then pressed at a temperature of 120° C. and a pressure of 10 kgf/cm$^2$ for 10 minutes and then at a temperature of 170° C. and a pressure of 40 kgf/cm$^2$ for 60 minutes. Thereafter, the necessary through holes or via holes were made with a drill and/or a laser, followed by roughening the surface with an alkaline oxidizing agent of a permanganate, conductor layers were formed over the whole surface by nonelectrolytic and/or electrolytic plating and a four-layer printed-wiring board was obtained in accordance with a subtractive process.

Comparative Manufacturing Example 1

A four-layer printed-wiring board was obtained in the same manner as in Manufacturing Example 1 using the epoxy resin composition obtained in Comparative Example 1.

Comparative Manufacturing Example 2

A four-layer printed-wiring board was obtained in the same manner as in Manufacturing Example 2 using the epoxy resin composition obtained in Comparative Example 2.

With regard to the four-layer printed-wiring boards obtained in Manufacturing Examples 1 to 3 and Comparative Manufacturing Examples 1 and 2, SEM photographs of the surfaces of the cured resin composition after roughening are shown in FIG. 1, and the results of measurement of conductor peel strength and heat resistance at boiling point are shown in Table 1.

TABLE 1

|  | Peel strength (kgf/cm) | Heat-resistance at boiling point |
|---|---|---|
| Manufacturing Ex. 1 | 0.90 | ○ |
| Manufacturing Ex. 2 | 1.1 | ○ |
| Manufacturing Ex. 3 | 1.0 | ○ |
| Comparative Manufact. Ex. 1 | 0.25 | x |
| Comparative Manufact. Ex. 2 | 0.30 | x |

Measurement of peel strength: The measurement was performed according to JIS C6481. Thickness of a plated conductor was about 30 $\mu$m.

Heat-resistance at boiling point: The four-layer printed-wiring boards obtained were evaluated by boiling treatment for 2 hours, followed by dipping them in a solder bath at 260° C. for 30 seconds. Evaluation was carried out by judging the appearance of the test boards with the eye. In the table, ○ means good, whereas × means occurrence of blister, peeling or measling.

From the results of Examples 1 to 3 and Manufacturing Examples 1 to 3, it was found that according to the process of the present invention, a copper plating excellent in adhesiveness was formed through roughening with an oxidizing agent and high thermal resistance was also attained, so that a highly reliable multilayer printed-wiring board could be manufactured by a build-up type technique. Particularly, the resin composition wherein the epoxy resin (A) contained a phosphorus atom, the phenolic curing agent (B) contained a nitrogen atom, and the phenoxy resin (C) contained a bisphenol S skeleton and a biphenyl skeleton, was found to be suitable for fine pattern formation owing to high peel strength and formation of minuter anchors upon roughening. On the other hand, in the case of Comparative Example 1 where the essential component (C) of the present invention was not used, protrusion exhibiting a sufficient anchoring effect was not formed by the action of an oxidizing agent, so that peel strength of the copper plating was found to be poor. Furthermore, in the case where an epoxy resin containing a phosphorus atom was used as in Comparative Example 2, the roughened surface was bad in shape even when a roughening component was contained and adhesion of the copper plating was poor, so that the resulting board had an inferior thermal resistance at boiling point and therefore, was not suitable for practical use.

Manufacturing Example 4

A laminate was formed by etching out the copper foil of a glass/epoxy laminate clad on both sides with a copper foil having a thickness of 18 μm stacking one sheet of the prepreg obtained in Example 5 on each of both the sides, laminating the prepreg on both the sides with a vacuum laminator with intervening release films at a temperature of 110° C., a pressure of 1 kgf/cm$^2$ and an environmental pressure of 5 mmHg or below, detaching the release films and curing under heating at 170° C. for 60 minutes. Thereafter, the surface was roughened with an alkaline oxidizing agent of a permanganate, and conductor layers of about 30 μm were formed by nonelectrolytic and/or electrolytic plating over the whole surface. The peel strength was 1.0 kgf/cm.

Manufacturing Example 5

A laminate having a thickness of 0.2 mm was formed by stacking two sheets of the prepreg obtained in Example 4, placing the stack between metal plates with intervening release films, and pressing the whole at a temperature of 120° C. and a pressure of 10 kgf/cm$^2$ for 15 minutes and then at a temperature of 170° C. and a pressure of 40 kgf/cm$^2$ for 60 minutes. Table 2 shows the properties of the resulting laminate. Thereafter, the surface was roughened with an alkaline oxidizing agent of a permanganate, and conductor layers of about 25 μm in thickness were formed by non-electrolytic and/or electrolytic plating over the whole surface. The peel strength was 0.9 kgf/cm.

TABLE 2

| Properties | of Laminate |
|---|---|
| CTE (ppm) | |
| x–y | 10.6 |
| z | 56 |
| Dielectric constant | |
| 1 MHz | 4.81 |
| 500 MHz | 4.4 |
| 1 GHz | 4.37 |
| Dielectric tangent | |
| 1 MHz | 0.026 |
| 500 MHz | 0.023 |
| 1 GHz | 0.022 |
| Tensile strength (kgf/mm$^2$) | 27.4 |
| Breaking elongation percentage (%) | 2.8 |
| Bending strength (kgf/mm$^2$) | |
| longitudinal | 49 |
| lateral | 50.3 |
| Bending elasticity | |
| longitudinal | 1749 |
| lateral | 1930 |

Effects of the Invention

According to the process of the present inventions it is possible to form a conductor layer excellent in adhesiveness suitable for fine pattern formation without requiring, in the insulating layer, a roughening component which deteriorates performance, in manufacturing a multilayer printed-wiring board of the build-up type.

What is claimed is:

1. An epoxy resin composition comprising, as the essential components, (A) an epoxy resin having two or more epoxy groups in one molecule, (B) a phenolic curing agent, (C) a phenoxy resin containing a bisphenol S skeleton and having a weight average molecular weight of 5,000 to 100,000, and (D) a curing accelerator, wherein the epoxy resin (A) contains a phosphorus atom.

2. The epoxy resin composition according to claim 1, wherein said phenolic curing agent (B) contains a nitrogen atom.

3. The epoxy resin composition according to claim 1, wherein said phenoxy resin (C) contains a bisphenol S skeleton and a biphenyl skeleton, and has a weight average molecular weight of 5,000 to 100,000.

4. The epoxy resin composition according to claim 1, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

5. An adhesive film which is obtainable by forming a thin film of an epoxy resin composition according to claim 1 on a supporting base film.

6. A multilayer printed-wiring board which is obtainable by the steps of (a) laminating the adhesive film according to claim 5 on a patterned internal-layer circuit board under conditions of pressurizing and heating, (b) detaching the supporting base film, if necessary, (c) curing the epoxy resin composition under heating, (d) roughening the surface of the cured product with an oxidizing agent, and (e) forming a conductor layer on the roughened surface by plating.

7. The multilayer printed-wiring board according to claim 6, wherein said phenolic curing agent (B) contains a nitrogen atom.

8. The multilayer printed-wiring board according to claim 6, wherein said phenoxy resin (C) contains a bisphenol S skeleton and a biphenyl skeleton, and has a weight average molecular weight of 5,000 to 100,000.

9. The multilayer printed-wiring board according to claim 6, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

10. A process for manufacturing a multilayer printed-wiring board comprising the steps of (a) laminating the adhesive film according to claim 5 on a patterned internal-layer circuit board under conditions of pressurizing and heating, (b) detaching the supporting base film, if necessary, (c) curing the epoxy resin composition under heating, (d) roughening the surface of the cured product with an oxidizing agent, and (e) forming a conductor layer on the roughened surface by plating.

11. The process according to claim 10, wherein said phenolic curing agent (B) contains a nitrogen atom.

12. The process according to claim 10, wherein phenoxy resin (C) contains a bisphenol S skeleton and a biphenyl skeleton, and has a weight average molecular weight of 5,000 to 100,000.

13. The process according to claim 10, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

14. A laminate which is obtainable by the steps of (a) laminating the adhesive film according to claim 5 on an etched copper surface of a copper foil-clad laminate under conditions of pressurizing and heating, wherein said copper foil-clad laminate comprises at least one copper foil-clad surface; (b) detaching the supporting base film, if necessary, and (c) curing the adhesive film with heating.

15. The laminate according to claim 14, wherein said phenolic curing agent (B) contains a nitrogen atom.

16. The laminate according to claim 14, wherein said phenoxy resin (C) contains a bisphenol S skeleton and a biphenyl skeleton, and has a weight average molecular weight of 5,000 to 100,000.

17. The laminate according to claim 14, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

18. The adhesive film according to claim 5, wherein said phenolic curing agent (B) contains a nitrogen atom.

19. The adhesive film according to claim 5, wherein said phenoxy resin (C) contains a bisphenol S skeleton and a biphenyl skeleton, and has a weight average molecular weight of 5,000 to 100,000.

20. The adhesive film according to claim 5, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

21. A prepreg which is obtainable by coating and/or impregnating a sheet-shape reinforced base material made of a fiber with an epoxy resin composition according to claim 1.

22. A multilayer printed-wiring board which is obtainable by the steps of (a) laminating the prepreg according to claim 21 on a patterned internal-layer circuit board under conditions of pressurizing and heating to integrate them, (b) roughening the surface of the prepreg with an oxidizing agent, and (c) forming a conductor layer on the roughened surface by plating.

23. The multilayer printed-wiring board according to claim 22, wherein said phenolic curing agent (B) contains a nitrogen atom.

24. The multilayer printed-wiring board according to claim 22, wherein said phenoxy resin (C) contains a bisphenol S skeleton and a biphenyl skeleton, and has a weight average molecular weight of 5,000 to 100,000.

25. The multilayer printed-wiring board according to claim 22, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

26. A process for manufacturing a multilayer printed-wiring board comprising the steps of (a) laminating the prepreg according to claim 21 on a patterned internal-layer circuit board under conditions of pressurizing and heating to integrate them, (b) roughening a surface of the prepreg with an oxidizing agent, and (c) forming a conductor layer on the roughened surface by plating.

27. The process according to claim 26, wherein said phenolic curing agent (B) contains a nitrogen atom.

28. The process according to claim 26, wherein said phenoxy resin (C) contains a bisphenol S skeleton and a biphenyl skeleton, and has a weight average molecular weight of 5,000 to 100,000.

29. The process according to claim 26, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

30. A laminate which is obtainable by laminating the prepreg according to claim 21 on an etched copper surface of a copper foil-clad laminate under conditions of pressurizing and heating, wherein said copper foil-clad laminate comprises at least one copper foil-clad surface.

31. The laminate according to claim 30, wherein said phenolic curing agent (B) contains a nitrogen atom.

32. The laminate according to claim 30, wherein said phenoxy resin (C) contains a bisphenol S skeleton and a biphenyl skeleton, and has a weight average molecular weight of 5,000 to 100,000.

33. The laminate according to claim 30, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

34. A laminate which is obtainable by laminating the prepreg according to claim 21 on a surface of a substrate under conditions of pressurizing and heating.

35. The laminate according to claim 34, wherein said phenolic curing agent (B) contains a nitrogen atom.

36. The laminate according to claim 34, wherein said phenoxy resin (C) contains a bisphenol S skeleton and a biphenyl skeleton, and has a weight average molecular weight of 5,000 to 100,000.

37. The laminate according to claim 34, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

38. The prepreg according to claim 21, wherein said phenolic curing agent (B) contains a nitrogen atom.

39. The prepreg according to claim 21, wherein said phenoxy resin (C) contains a bisphenol S skeleton and a biphenyl skeleton, and has a weight average molecular weight of 5,000 to 100,000.

40. The prepreg according to claim 21, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

41. A multilayer printed-wiring board comprising a cured product of an epoxy resin composition according to claim 1, wherein said cured product comprises a roughened surface having a plated conductor layer formed thereon, and wherein said cured product comprises a second surface closely laminated onto a patterned internal-layer circuit board.

42. The multilayer printed-wiring board according to claim 41, wherein said phenolic curing agent (B) contains a nitrogen atom.

43. The multilayer printed-wiring board according to claim 41, wherein said phenoxy resin (C) contains a bisphenol S skeleton and a biphenyl skeleton, and has a weight average molecular weight of 5,000 to 100,000.

44. The multilayer printed-wiring board according to claim 41, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

45. A multilayer printed-wiring board which is obtainable by the steps of (a) coating a patterned internal-layer circuit board with an epoxy resin composition according to claim 1, (b) curing it under heating, (c) roughening the surface of the cured product with an oxidizing agent, and (d) forming a conductor layer on the roughened surface by plating.

46. The multilayer printed-wiring board according to claim 45, wherein said phenolic curing agent (B) contains a nitrogen atom.

47. The multilayer printed-wiring board according to claim 45, wherein said phenoxy resin (C) contains a bisphenol S skeleton and a biphenyl skeleton, and has a weight average molecular weight of 5,000 to 100,000.

48. The multilayer printed-wiring board according to claim 45, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

49. A process for manufacturing a multilayer printed-wiring board comprising the steps of (a) coating a patterned internal-layer circuit board with an epoxy resin composition according to claim 1, (b) curing said composition with heating to obtain a cured composition, (c) roughening the surface of said cured composition with an oxidizing agent to obtain a roughened surface, and (d) forming a conductor layer on said roughened surface by plating.

50. The process according to claim 49, wherein said phenolic curing agent (B) contains a nitrogen atom.

51. The process according to claim 49, wherein said phenoxy resin (C) contains a bisphenol S skeleton and a biphenyl skeleton, and has a weight average molecular weight of 5,000 to 100,000.

52. The process according to claim 49, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

53. A laminate which is obtainable by the steps of (a) coating an etched copper surface of a copper foil-clad laminate with an epoxy resin composition according to claim 1, wherein said copper foil-clad laminate comprises at least one copper foil-clad surface; and (b) curing said composition with heating.

54. The laminate according to claim 53, wherein said phenolic curing agent (B) contains a nitrogen atom.

55. The laminate according to claim 53, wherein said phenoxy resin (C) contains a bisphenol S skeleton and a biphenyl skeleton, and has a weight average molecular weight of 5,000 to 100,000.

56. The laminate according to claim 53, wherein 5 to 50 parts by weight of said phenoxy resin (C) and 0.05 to 10 parts by weight of said curing accelerator (D) are mixed with 100 parts by weight in total of said epoxy resin (A) and said phenolic curing agent (B).

\* \* \* \* \*

UNITED STATES PATENT AND TRADEMARK OFFICE
CERTIFICATE OF CORRECTION

PATENT NO. : 6,403,221 B1
DATED : June 11, 2002
INVENTOR(S) : Shigeo Nakamura et al.

It is certified that error appears in the above-identified patent and that said Letters Patent is hereby corrected as shown below:

Column 13,
Line 41, "18 µm stacking" should read -- 18 µm, stacking --.

Column 14,
Line 28, "present inventions it is" should read -- present invention, it is --.

Signed and Sealed this

Eleventh Day of March, 2003

JAMES E. ROGAN
*Director of the United States Patent and Trademark Office*